(12) United States Patent
Kazama et al.

(10) Patent No.: US 7,956,288 B2
(45) Date of Patent: Jun. 7, 2011

(54) CONDUCTIVE CONTACT AND METHOD OF MANUFACTURING CONDUCTIVE CONTACT

(75) Inventors: Toshio Kazama, Nagano (JP); Shigeki Ishikawa, Nagano (JP)

(73) Assignee: NHK Spring Co., Ltd., Yokohama-Shi (JP)

( * ) Notice: Subject to any disclaimer, the term of this patent is extended or adjusted under 35 U.S.C. 154(b) by 140 days.

(21) Appl. No.: 11/991,560

(22) PCT Filed: Sep. 7, 2006

(86) PCT No.: PCT/JP2006/317789
§ 371 (c)(1),
(2), (4) Date: Feb. 18, 2009

(87) PCT Pub. No.: WO2007/029791
PCT Pub. Date: Mar. 15, 2007

(65) Prior Publication Data
US 2009/0183898 A1    Jul. 23, 2009

(30) Foreign Application Priority Data

Sep. 9, 2005   (JP) .................................. 2005-263036

(51) Int. Cl.
*H01R 4/02* (2006.01)
(52) U.S. Cl. .................................................. 174/94 R
(58) Field of Classification Search ............... 174/94 R; 29/874
See application file for complete search history.

(56) References Cited

U.S. PATENT DOCUMENTS

| 4,034,152 A * | 7/1977 | Warner ........................ 174/94 R |
| 2006/0272844 A1* | 12/2006 | Berghofer et al. .......... 174/94 R |

FOREIGN PATENT DOCUMENTS

| CN | 1580787 A | 2/2005 |
|---|---|---|
| JP | 03-209173 | 9/1991 |
| JP | 03-209174 | 9/1991 |
| JP | 06-230033 | 8/1994 |
| JP | 11-248747 | 9/1999 |
| JP | 2001-050982 | 2/2001 |
| JP | 2001-074779 | 3/2001 |
| JP | 2001-337109 | 12/2001 |
| JP | 2001-356135 | 12/2001 |
| JP | 2004-239667 | 8/2004 |
| JP | 2005-172509 | 6/2005 |
| TW | 200307134 | 12/2003 |

OTHER PUBLICATIONS

Office Action dated Feb. 26, 2010, issued in the corresponding Chinese Patent Application No. 200680032853.7.
Notice of Allowance dated Jul. 21, 2009, issued in the corresponding Taiwanese patent application No. 95133225.

* cited by examiner

*Primary Examiner* — Chau N Nguyen
(74) *Attorney, Agent, or Firm* — Edwards Angell Palmer & Dodge LLP

(57) ABSTRACT

A shape of a cross-section perpendicular to a longitudinal direction of a main body section of a conductive contact is anisotropic.

14 Claims, 15 Drawing Sheets

PRIOR ART

CONDUCTIVE CONTACT AND METHOD OF MANUFACTURING CONDUCTIVE CONTACT

TECHNICAL FIELD

The present invention relates to a conductive contact that establishes electric connection with a circuit configuration including a plurality of connection terminals by being in physical contact with the connection terminals, and a method of manufacturing such a conductive contact.

BACKGROUND ART

Conductive contacts are employed in performing electric characteristic inspection of a circuit configuration including a plurality of connection terminals. Specifically, these conductive contacts are made to come in physical contact with the connection terminals of the inspection apparatus to establish electric connection with the connection terminals. Wire probe conductive contacts having a circular cross-section are known as such conductive contacts. When a plurality of conductive contacts of the wire probe type are attached to a conductive contact unit, various contrivances are made to align directions in which the conductive contacts bend when an external force acts on main bodies of the conductive contacts (see, for example, Patent Documents 1 to 3). In these conventional technologies, the bending directions of the conductive contacts are aligned by shifting both ends of each of the conductive elements in a lateral direction by a predetermined distance.

FIG. 24 is a diagram of another example of attachment of the conventional conductive contact to the conductive contact unit. FIG. 25 is an enlarged diagram of the structure near the conductive contact that is in contact with an inspection apparatus. In a conductive contact 501 shown in these figures, an insulating layer 512 is formed in a main body section 511 of the conductive contact 501 excluding the ends in a longitudinal direction thereof. The main body section 511 has a circular cross-section.

A conductive contact unit that stores and holds the conductive contact 501 having the structure described above includes a two-layer first plate 600 on a side (an upper side in FIG. 24) toward which a circuit configuration for inspecting an inspection object is connected, and includes a three-layer second plate 700 on a side (a lower side in FIG. 24) toward which the inspection apparatus is connected. The two-layer first plate 600 includes an upper layer plate 601 and a lower layer plate 602, while the three-layer second plate 700 includes an upper layer plate 701, an intermediate layer plate 702, and a lower layer plate 703. An electrode 802 of a circuit board 801 of the inspection apparatus is in contact with a bottom surface of the lower layer plate 703, and one end of the attached conductive contact 501 is in contact with the electrode 802.

The upper layer plate 601 of the first plate 600 has a hole of a diameter larger than the diameter of the main body section 511 and smaller than the diameter of a section covered with an insulating layer 512. The lower layer plate 602 of the first plate 600 has a hole into which the section covered with the insulating layer 512 can enter. These two holes are stacked to be vertically coaxial.

In the second plate 700, a hole 711 of the upper layer plate 701 and a hole 712 of the intermediate layer plate 702 have the same diameter ($R_2$). Both the main body section 511 (diameter $r_1$) and the section covered with the insulating layer 512 (diameter $r_2$) can enter into the holes 711 and 712. On the other hand, a hole 713 of the lower layer plate 703 has a diameter ($R_1$) smaller than that of the hole of the upper layer plate 701. In other words, only the ends of the main body section 511 can be inserted through the hole 713. That is, the four diameters $r_1$, $r_2$, $R_1$, and $R_2$ are in a relation $r_1 < R_1 < r_2 < R_2$.

The three plates of the second plate 700 are arranged such that the center axes of their holes are shifted by very small distances from one another. Consequently, these plates exert force on the attached conductive contact 501 to bend the attached conductive contact 501 in a predetermined direction.

Patent Document 1: Japanese Patent Application Laid-open No. 2001-337109
Patent Document 2: Japanese Patent Application Laid-open No. H11-248747
Patent Document 3: Japanese Patent Application Laid-open No. 2001-50982

DISCLOSURE OF INVENTION

Problem to be Solved by the Invention

As described above, the conventional conductive contact has a circular cross-section. Therefore, for example, as shown in FIG. 6 of Patent Document 3, the upper plate and the lower plate are shifted from each other to shift the center axes of the holes and align a bending direction of the conductive contact. However, actually, the alignment of the bending direction is still insufficient. Therefore, as described above, the holes of the two plates through which both the ends are inserted are shifted to force to control the bending direction of the conductive contact (see FIG. 24). However, in the structure shown in FIG. 24, because machining for shifting the center axes of the holes provided in the respective plates is performed, design of hole machining positions becomes complicated and the designing process takes time. Because certain amount of machining error generally exists in machining the plate holes, it is uncertain whether the holes actually shift stepwise when the plates are stacked. Therefore, in the conventional conductive contact unit, it is difficult to uniformalize loads on electrodes of circuit boards of respective conductive contacts and uniformalize contact resistances in respective contact sections. It is likely that a problem occurs in accuracy of electric characteristic inspection itself.

The present invention has been devised in view of the above and it is an object of the present invention to provide a conductive contact in which it is possible to easily control a direction in which a conductive contact bends when an external force is applied thereto and realize more highly accurate and reliable electric characteristic inspection, and a method of manufacturing such a conductive contact.

Means for Solving Problem

To solve the above problems and to achieve the above object, the invention disclosed in claim 1 is a conductive contact that establishes electric connection with a circuit configuration including a plurality of connection terminals by being in physical contact with any one of the connection terminals, wherein a shape of a cross-section perpendicular to a longitudinal direction of a main body section of the conductive contact is anisotropic.

In the invention disclosed in claim 2, in view of the invention disclosed in claim 1, the cross-section perpendicular to the longitudinal direction of the main body section has a shape symmetrical to each of two axes that pass through the cross-section and are orthogonal to each other.

The invention disclosed in claim 3, in view of the invention disclosed in claim 1, further includes a stacked section stacked on the main body section and formed of a material different from that of the main body section.

The invention disclosed in claim 4, in view of the invention disclosed in one of claims 1 to 3, further includes an insulating layer that covers a surface of an area including a section near a center in the longitudinal direction of the main body section and not including both ends of the main body section.

In the invention disclosed in claim 5, in view of the invention disclosed in one of claims 1 to 3, one or a plurality of through holes are provided in the main body section.

In the invention disclosed in claim 6, in view of the invention disclosed in one of claims 1 to 3, at least one end of ends in the longitudinal direction of the main body section is sharp.

In the invention disclosed in claim 7, in view of the invention disclosed in one of claims 1 to 3, the conductive contact has a narrowed section formed by cutting out a part of sides in the longitudinal direction of the main body section.

In the invention disclosed in claim 8, in view of the invention disclosed in claim 7, the narrowed section is provided near a center in the longitudinal direction of the main body section.

The invention disclosed in claim 9 is a method of manufacturing a conductive contact that establishes electric connection with a circuit configuration including a plurality of connection terminals by being in physical contact with any one of the connection terminals, the method comprising molding a main body group in which main body sections of a plurality of conductive contacts formed in a same shape by using metal are coupled while forming a translational symmetry positional relation with one another; and forming an insulating layer on a surface of an area including a section near a center in a longitudinal direction of each of the main body sections included in the main body section group molded in the molding and not including both ends of each of the main body sections, wherein in each of the main body sections of the conductive contacts molded in the molding, a shape of a cross-section perpendicular to a longitudinal direction is anisotropic, the main body section includes a narrowed section formed by cutting out a part of sides in the longitudinal direction, and narrowed sections of the main body sections adjacent to each other are coupled.

In the invention disclosed in claim 10, in view of the invention disclosed in claim 9, an area of a cross-section perpendicular to a longitudinal direction of a coupling section that couples the narrowed sections adjacent to each other is smaller than an area of the cross-section perpendicular to the longitudinal direction of the main body section in the narrowed section.

The invention disclosed in claim 11, in view of the invention disclosed in claim 10, further includes rotating the coupling section coupled to each of the conductive contacts on which the insulating layer is formed in the forming and removing each of the conductive contacts from the main body section group.

EFFECT OF THE INVENTION

According to a conductive contact and a method of manufacturing the conductive contact according to the present invention, because the shape of a section perpendicular to a longitudinal direction of a main body section of the conductive contact is made anisotropic, it is possible to easily control a direction in which the conductive contact bends when an external force is applied thereto and realize more highly accurate and reliable electric characteristic inspection.

Figure 1:
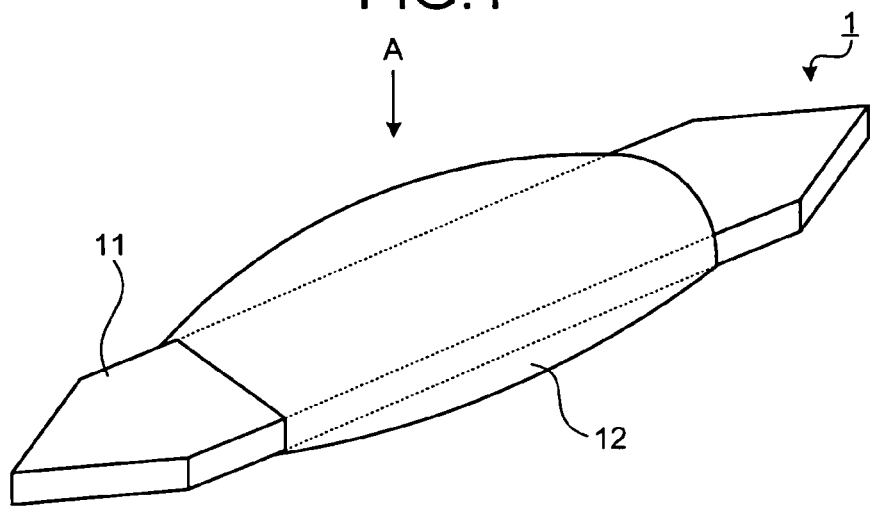
FIG. 1 is a perspective view of a conductive contact according to a first embodiment of the present invention.

EXPLANATIONS OF LETTERS OR NUMERALS 1, 2, 3, 4, 5, 6, 7, 8, 9, 10, 501 Conductive contacts
11, 21, 61, 71, 81, 91, 101, 151, 511 Main body sections
12, 105, 512 Insulating layers
22, 92 Through holes
31, 41, 51 Ends
32, 42, 52 Body sections
62, 72, 82, 93 Stacked sections
100, 150 Main body section groups
102, 152 Narrowed sections
102a Side
103, 153 Coupling sections
104, 154 Holding frame sections
111, 112, 113 Distal ends
200 Conductive contact unit
201, 600 First plates
202, 700 Second plates
211, 212, 711; 712, 713 Holes
301, 801 Circuit boards
302, 802 Electrodes
401 Semiconductor integrated circuit
402 Electrode for connection
601, 701 Upper layer plates
602, 703 Lower layer plates
702 Intermediate layer plate
G Conductive contact group

BEST MODE(S) FOR CARRYING OUT THE INVENTION

Best modes for carrying out the present invention (hereinafter referred to as "embodiments") are explained below with reference to the accompanying drawings. It should be noted that the drawings are schematic and a relation between thicknesses and widths of respective sections, a ratio of thicknesses of the respective sections, and the like can be different from realistic ones. It goes without saying that sections having different relations and ratios of dimensions among the drawings can be included.

First Embodiment

Figure 2:
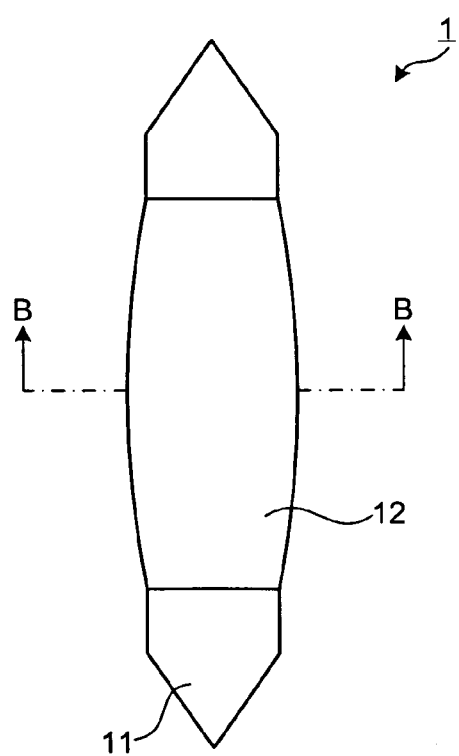
FIG. 2 is a top view from the direction of an arrow A shown in FIG. 1.
Figure 3:
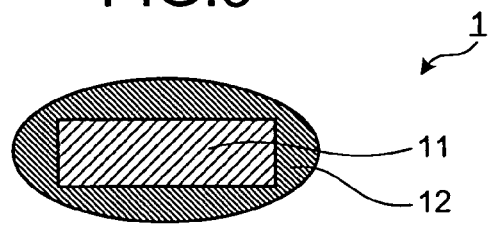
FIG. 3 is a cross-sectional view taken along line B-B in FIG. 2.

FIG. 1 is a perspective view of a conductive contact according to a first embodiment of the present invention. FIG. 2 is a top view from the direction of an arrow A shown in FIG. 1. FIG. 3 is a cross-sectional view taken along line B-B in FIG. 2. A conductive contact 1 shown in these figures is a wire probe and includes a main body section 11 formed in a flat shape and having both ends sharpened in a V shape at both ends and an insulating layer 12 formed to cover the surface of the main body section 11 near the center excluding both the ends of this main body section 11. A cross-section (a horizontal cross-section) in a direction perpendicular to a longitudinal direction of the main body section 11 is rectangular in cross-section as shown in FIG. 3 as well. On the other hand, the entire conductive contact 1 including the insulating layer 12 is substantially elliptical in cross-section. Thus, in the conductive contact 1, a cross-sectional shape in the direction perpendicular to the longitudinal direction of the main body section 11 is anisotropic. In particular, in the first embodiment, the conductive contact 1 is formed in a shape symmetrical to each of two axes that pass the cross-section and are orthogonal to each other.

Figure 4:
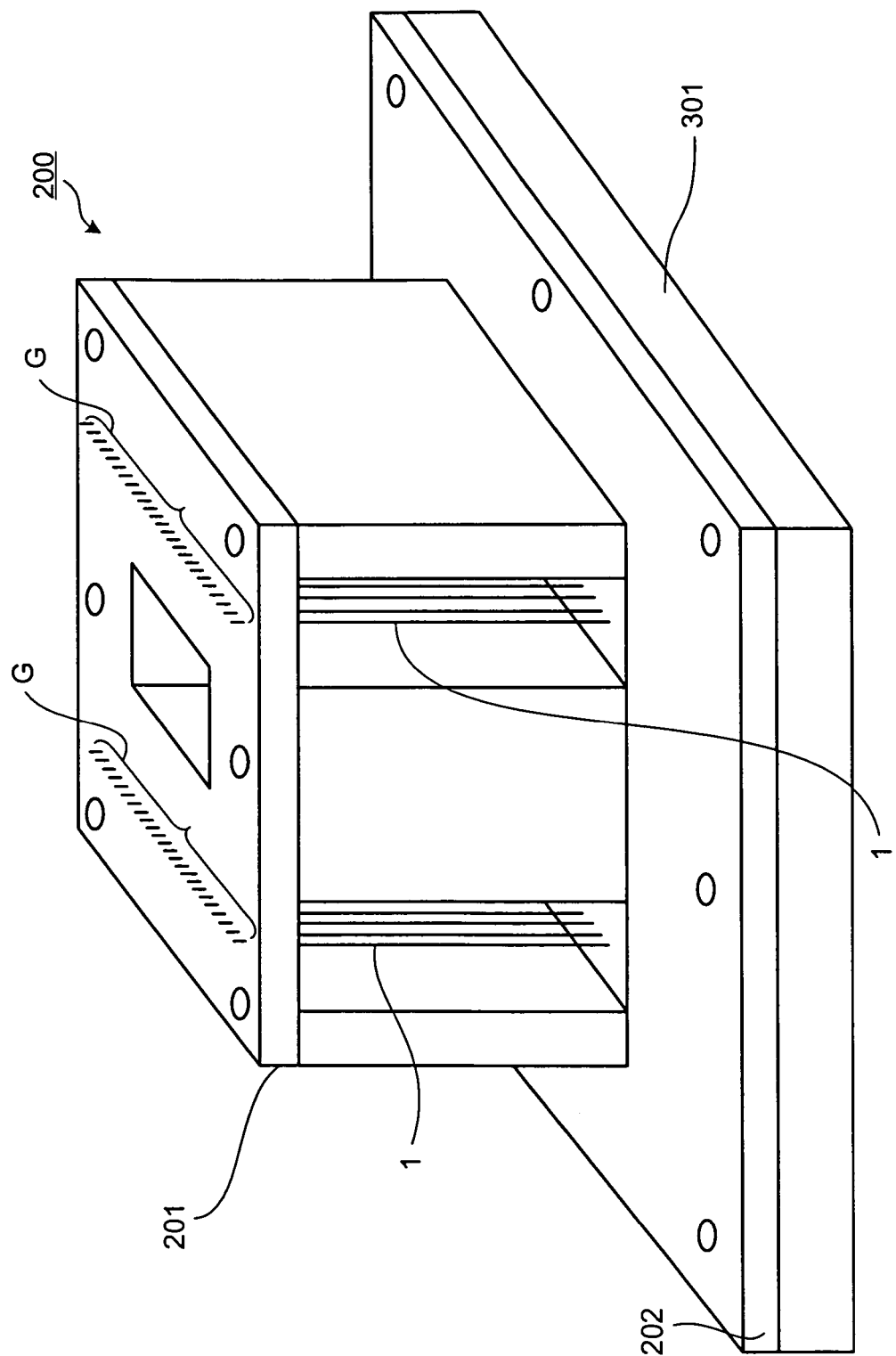
FIG. 4 is a perspective view of a conductive contact unit that stores the conductive contact according to the first embodiment of the present invention.

FIG. 4 is a perspective of a conductive contact unit that stores the conductive contact 1 having the structure described above. A conductive contact unit 200 shown in the figure stores a plurality of the conductive contacts 1 and establishes electric connection between a circuit configuration of a semiconductor integrated circuit or the like, which is an inspection object of electric characteristic inspection, and an inspection apparatus. The conductive contact unit 200 includes a first plate 201 and a second plate 202 that are provided near both ends of the respective conductive contacts 1 and stores and holds the respective conductive contacts 1. The conductive contacts 1 are regularly disposed between these two plates. In the case shown in FIG. 4, a conductive contact group G is configured by arranging the conductive contacts 1 in one row. However, this is only an example and an arrangement pattern of the conductive contact group G is decided according to an arrangement pattern of electrodes for connection (connection terminals) of the circuit configuration of the inspection object.

Figure 5:
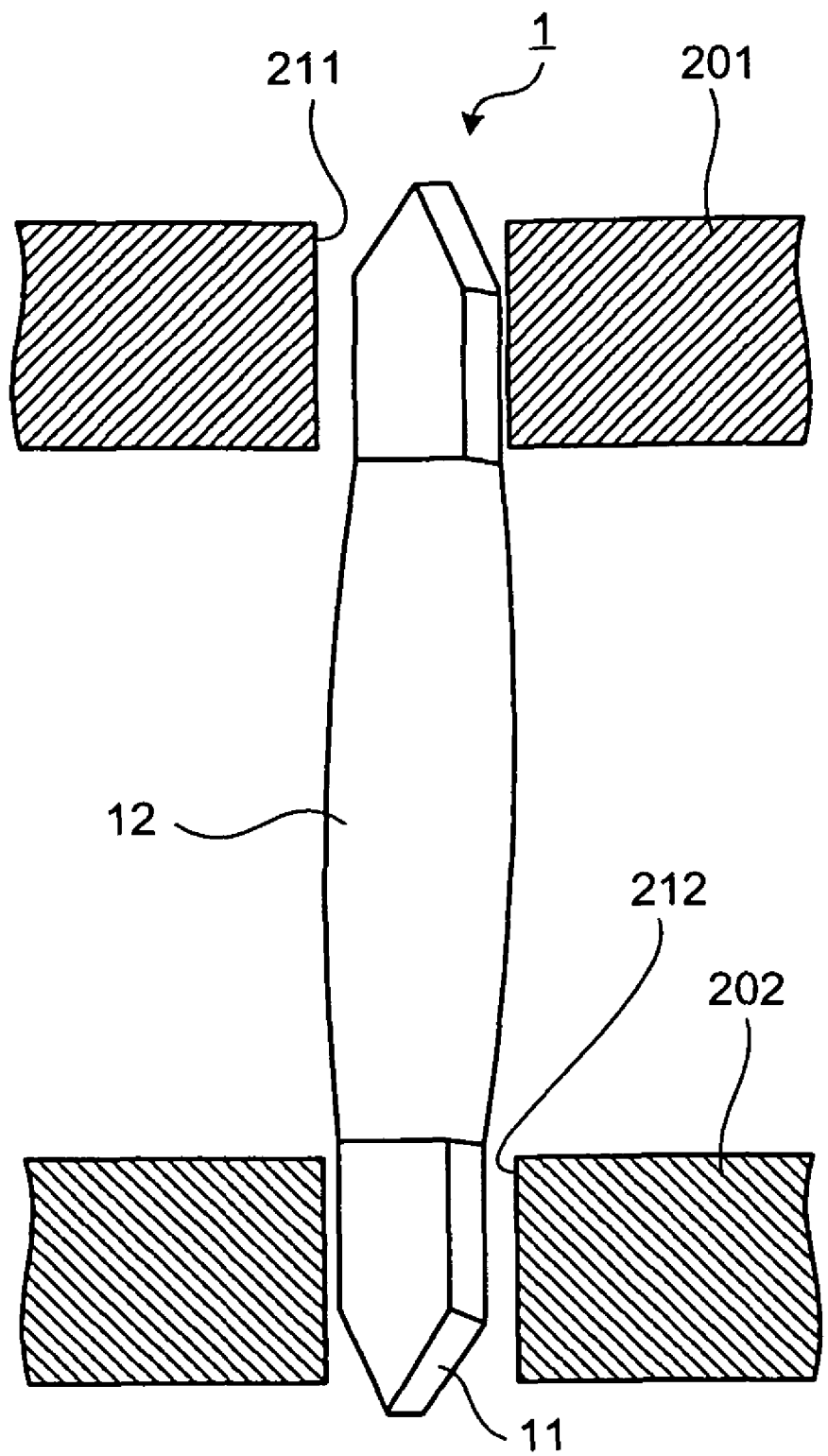
FIG. 5 is a diagram of a state before the conductive contact according to the first embodiment of the present invention is attached to the conductive contact unit and offset.

FIG. 5 is a diagram of a state in a process of storing and attaching the conductive contact 1 according to the first embodiment in the conductive contact unit 200 (for convenience of illustration, the longitudinal direction of the conductive contact 1 is shown short compared with the same in FIG. 4). A distal end of the conductive contact 1 projecting from a hole 211 of the first plate 201 located in an upper part in FIGS. 4 and 5 comes into contact with the electrode for connection provided in the circuit configuration of the inspection object. On the other hand, other distal end of the conductive contact 1 projecting from a hole 212 of the second plate 202 located in a lower part in FIGS. 4 and 5 comes into contact with an electrode of a circuit board 301 of the inspection apparatus. When electric characteristic inspection is carried out by using the conductive contact unit 200, usually, the conductive contact unit 200 is vertically reversed from that shown in FIG. 4. In the drawings described below, for convenience of explanation, a vertical positional relation same as that shown in FIG. 4 is kept.

The hole 211 of the first plate 201 and the hole 212 of the second plate 202 are formed in columnar shapes through which the conductive contact 1 can be inserted and that have the same diameter. When the conductive contact 1 is attached to the conductive contact unit 200, from a state shown in FIG. 5, any one of the first plate 201 and the second plate 202 is moved in a horizontal direction in the figure with respect to the other plate (this operation is hereinafter referred to as "offset"), whereby center axes of the holes 211 and 212 coaxial in FIG. 5 are shifted. As a result, the conductive contact 1 is subjected to an external force and starts to bend. The cross-section in the longitudinal direction of the conductive contact 1 is formed in the shape having anisotropy as described above. Therefore, the conductive contact starts to bend in a direction in which a cross-section modulus is small, i.e., a direction perpendicular to long sides of a rectangle, which is a cross-sectional shape of the main body section 11, (a direction in which the plate thickness is small).

Figure 6:
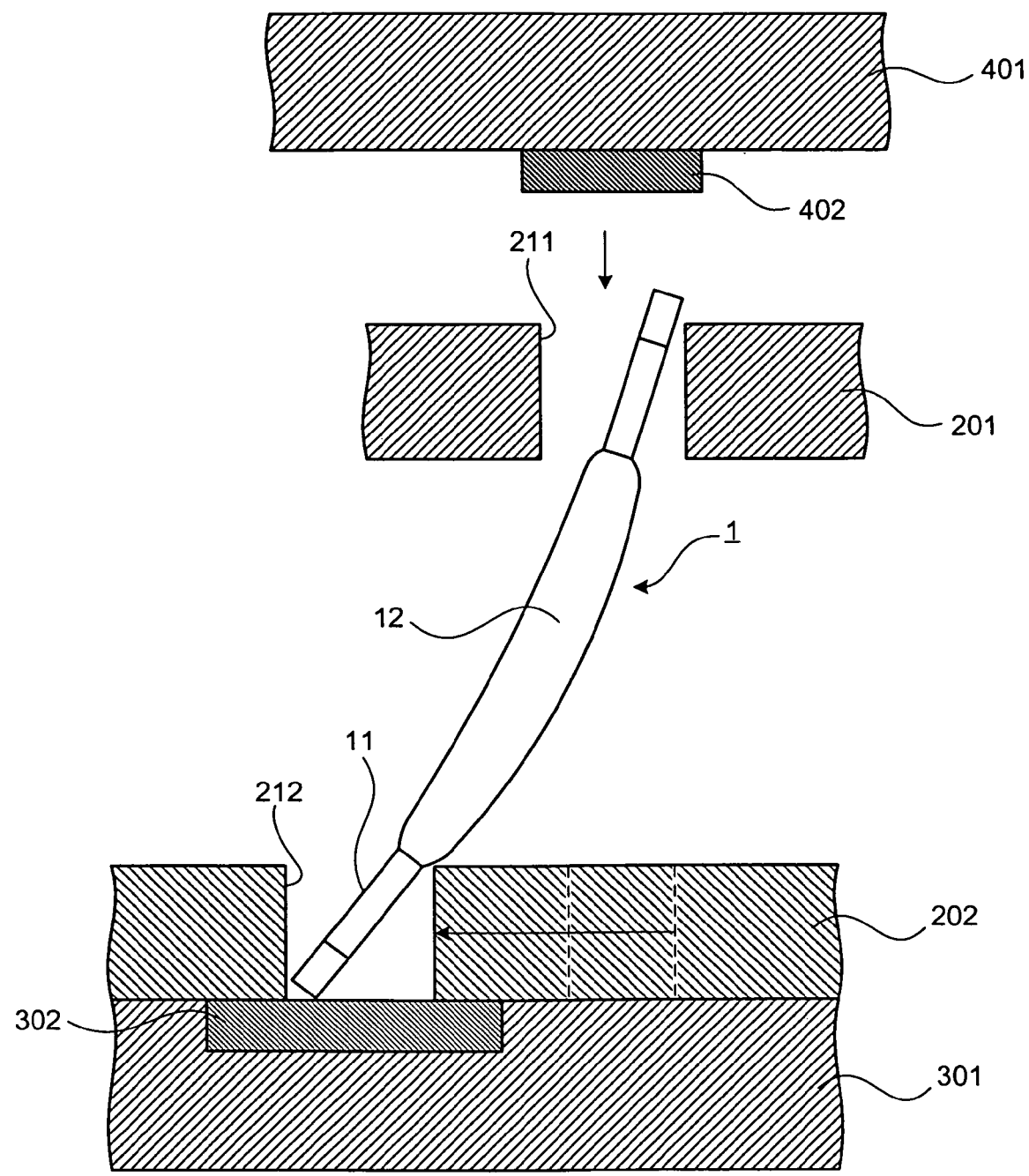
FIG. 6 is a diagram of a state after the conductive contact according to the first embodiment of the present invention is attached to the conductive contact unit and offset.

FIG. 6 is a diagram of an attachment state of the conductive contact 1 after offset. As shown in this figure, the conductive contact 1 is in a state in which the conductive contact 1 is bent to bring the surface of the main body section 11 on the long side into contact with the ends of the holes 211 and 212. In this state, a distal end section of the main body section 11 projecting from the hole 211 of the first plate 201 comes into contact with an electrode for connection 402 of a semiconductor integrated circuit 401 of the inspection object. On the other hand, a distal end section of the main body section 11 stored in the hole 212 of the second plate 202 comes into contact with an electrode 302 of the circuit board 301.

Figure 7:
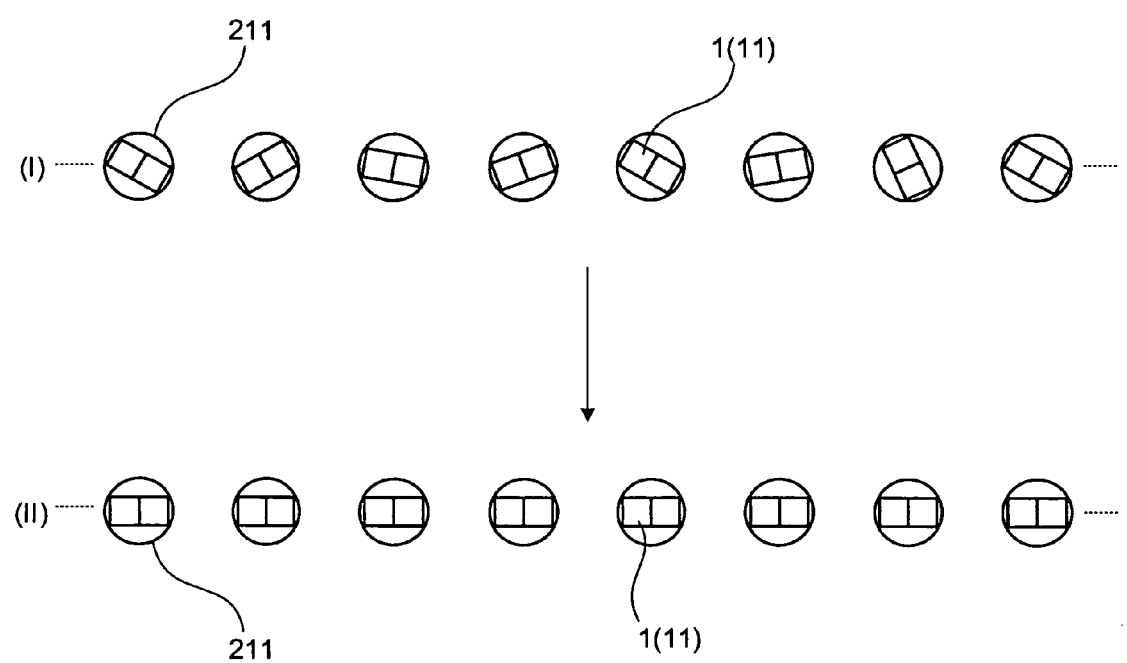
FIG. 7 is a diagram of states of respective distal ends of a conductive contact group before and after offset.

FIG. 7 is a diagram of states of distal ends of the conductive contacts 1 before and after offset and is equivalent to a top view of (a part of) the holes 211 forming the conductive contact group G viewed from an upper surface of the conductive contact unit 200. As shown in FIG. 7, in a state I (see FIG. 5) before offset in which center axes of the holes 211 and 212 in upper and lower parts are aligned, distal end sections of the respective conductive contacts 1 are directed to random directions. On the other hand, in a state II (see FIG. 6) after offset, because the respective conductive contacts 1 bend in the same manner, the distal end sections of the conductive contacts 1 projecting from the respective holes 211 are directed to an aligned direction.

In the case of the conventional wire probes having the circular cross-sectional shape, cross-sections perpendicular to longitudinal directions of main body sections are isotropic. Therefore, even if plates are offset in the same manner, it is difficult to uniformalize bending states of all the wire probes. On the other hand, in conductive contacts according to the first embodiment, the cross-sections perpendicular to the longitudinal directions of the main body sections are non-isotropic and have anisotropy. Therefore, it is possible to uniformalize bending states simply by offsetting the conductive contacts as described above.

A method of manufacturing the conductive contact 1 is explained. The conductive contact 1 is manufactured by forming the main body section 11 using machining technologies such as plating, etching (including wet etching and dry etching), electrocasting lithography (including X-ray lithography and ultraviolet lithography), and electric discharge machining (including wire electric discharge machining) and, then, forming the insulating layer 12 on the surface of the main body section 11 with a technology such as coating (including calendaring, extrusion, immersion, spray, spread, and electro-deposition). The insulating layer 12 can be formed by using machining technologies such as chemical vapor deposition (CVD), sputtering, and plating.

As metal forming the main body section portion 11, metal excellent in abrasion resistance such as iron (Fe), nickel (Ni), and tungsten (W) can be applied. As the insulating layer 12, insulating members of polyurethane, poly-para-xylylene, and the like can be applied. Moreover, insulating films formed of oxide films of alumite and the like can be used as the insulating layer 12.

According to the first embodiment of the present invention explained above, by giving anisotropy to the shape of the cross-section perpendicular to the longitudinal direction of the main body section of the conductive contact, it is possible to easily control a direction in which the conductive contact bends when an external force is applied thereto. As a result, when the conductive contacts according to the first embodiment are attached to the conductive contact unit to perform electric characteristic inspection, loads on electrodes of the respective conductive contacts are uniformalized. Therefore, it is possible to uniformalize contact resistances in respective contact sections and it is possible to realize more highly accurate and reliable electric characteristic inspection.

According to the first embodiment, by forming the insulating layer that covers the surface of the area including a section near the center in the longitudinal direction of the main body section and not including both the ends of the main body section, it is possible to prevent electric short-circuit of conductive contacts adjacent to each other when a plurality of conductive contacts are attached to the conductive contact unit and prevent damages and the like due to contact of the conductive contacts.

Moreover, according to the first embodiment, by giving anisotropy to the shape of the cross-section perpendicular to the longitudinal direction of the main body section of the conductive contact, the structure of the plate of the conductive contact unit that holds the conductive contact can be simple (see FIGS. 5 and 6). Therefore, design is easy and cost is low.

Modifications of the First Embodiment

Figure 8:
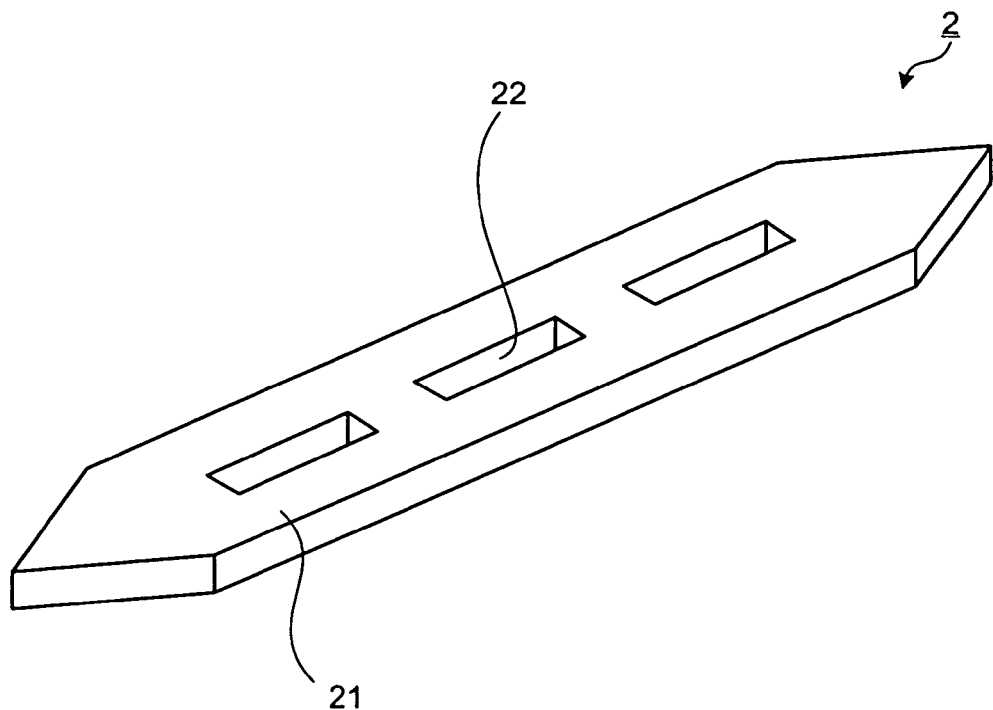
FIG. 8 is a perspective view of a conductive contact according to a first modification of the first embodiment of the present invention.

FIG. 8 is a perspective view of the structure of a main body section of a conductive contact according to a first modification of the first embodiment. In a conductive contact 2 shown in the figure, three through holes 22 having the same shape are formed in a main body section 21 formed in a flat shape and having both ends sharpened in a V shape. The through holes 22 are through holes for adjusting a spring constant of the conductive contact 2. The number, a shape, and a setting position of the through holes 22 are not limited to those shown in FIG. 2.

Figure 9:
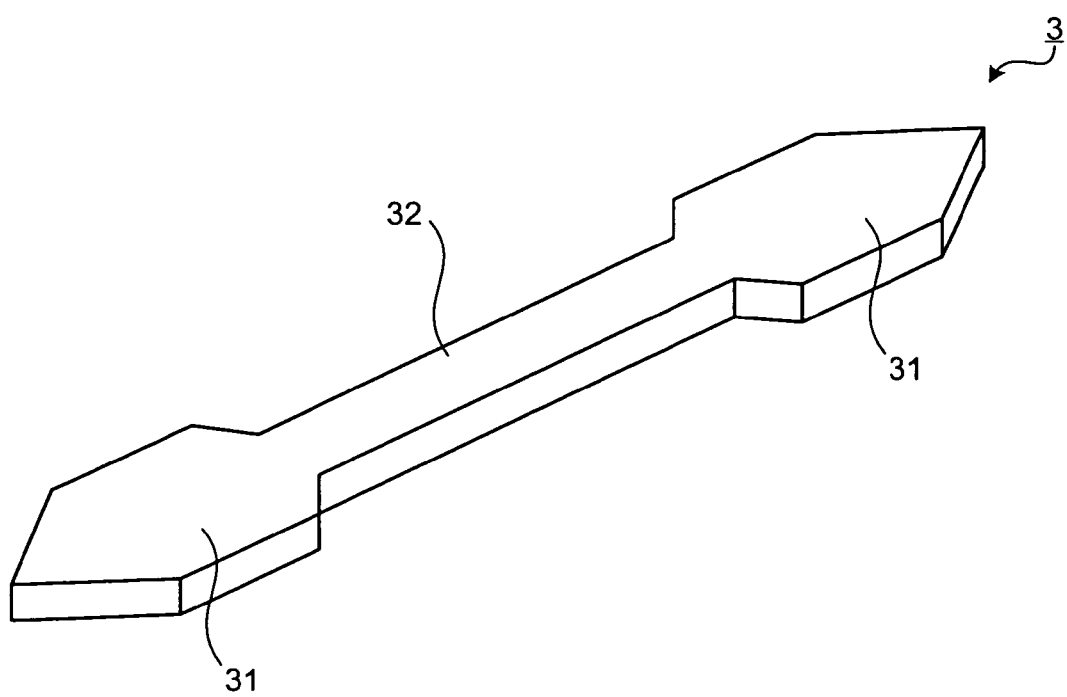
FIG. 9 is a perspective view of a conductive contact according to a second modification of the first embodiment of the present invention.

FIG. 9 is a perspective view of the structure of a main body section of a conductive contact according to a second modification of the first embodiment. A conductive contact 3 shown in the figure has two ends 31 having sharpened ends of a V shape and a body section 32 placed between the two ends 31. The conductive contact 3 formed in such a shape is obtained by cutting out a section near the center of the main body section 11 of the conductive contact 1 described above. In this case, by forming the body section 32 in a narrowed shape compared with the other sections, it is possible to give a spring constant different from that of the main body section 11 of the conductive contact 1 to the body section 32. The shape (width, length, etc.) of the body section 32 can be changed as appropriate.

Figure 10:
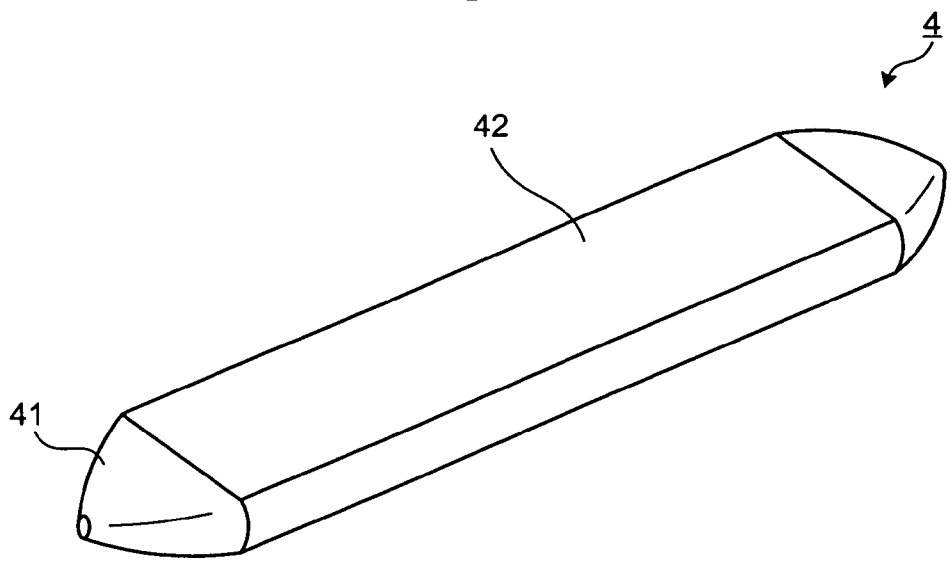
FIG. 10 is a perspective view of a conductive contact according to a third modification of the first embodiment of the present invention.
Figure 24:
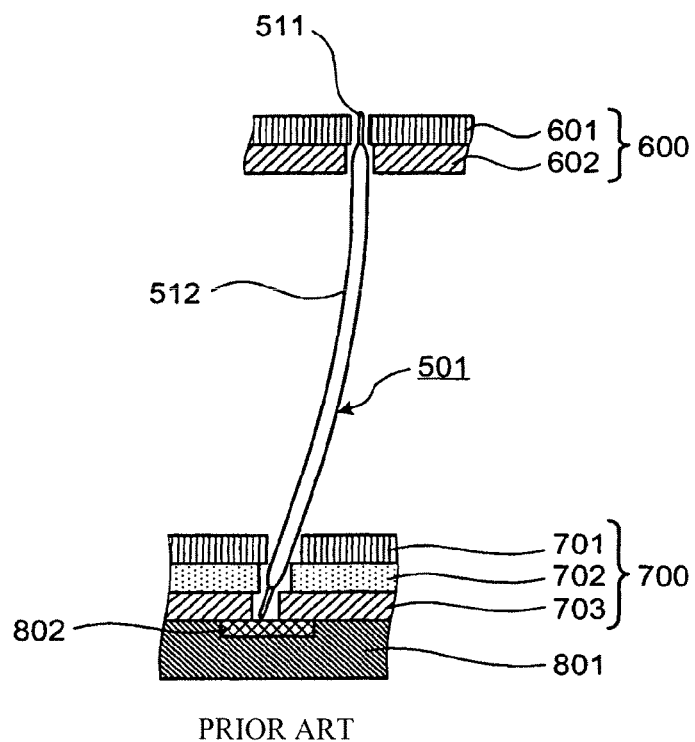
FIG. 24 is a diagram of an example of attachment of a conventional conductive contact to a conductive contact unit.
Figure 25:
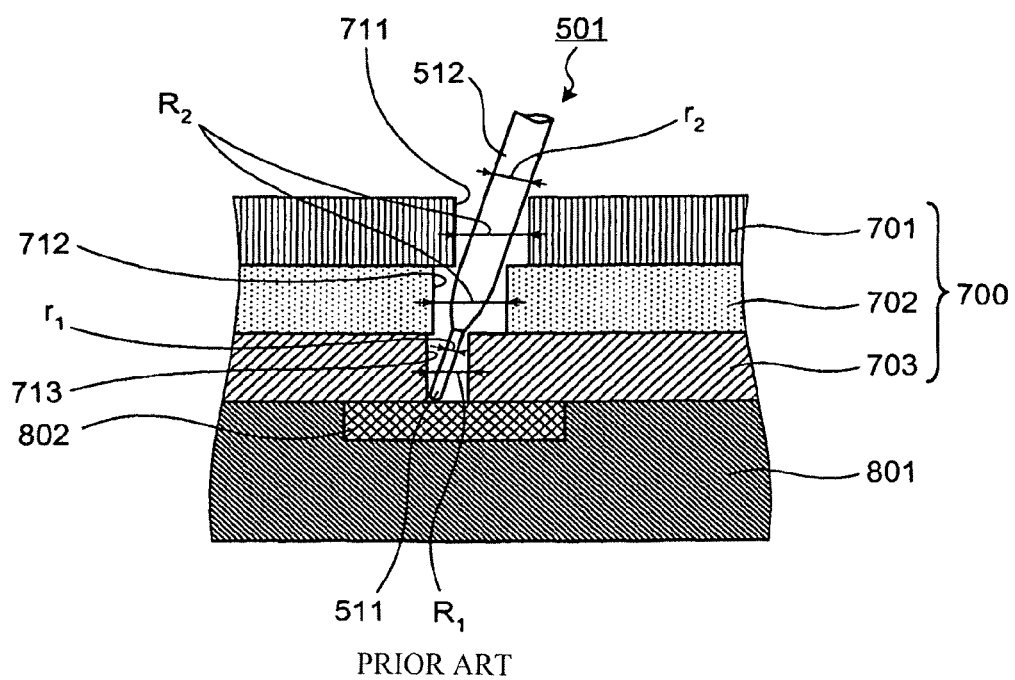
FIG. 25 is a partially enlarged view of the attachment structure of the conductive contact that is in contact with an inspection apparatus side.

FIG. 10 is a perspective view of a conductive contact according to a third modification of the first embodiment. In a conductive contact 4 shown in the figure, ends 41 are formed in a substantially elliptical circular truncated cone shape and, on the other hand, a body section 42 is formed in a flat shape. The conductive contact 4 having such a shape can be molded by applying press work to the conventional wire probe (see the conductive contact 501 shown in FIG. 24). Therefore, it is possible to hold down manufacturing cost particularly low.

Figure 11:
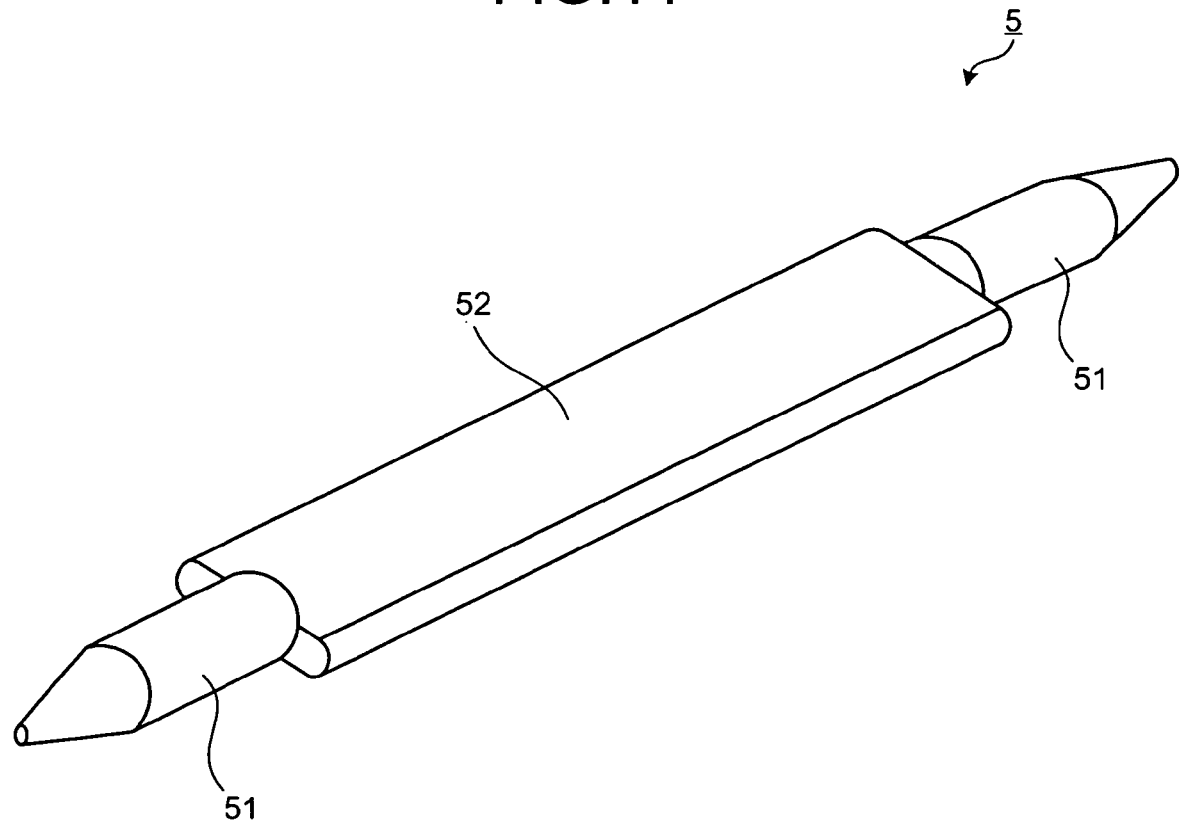
FIG. 11 is a perspective view of a conductive contact according to a fourth modification of the first embodiment of the present invention.

FIG. 11 is a perspective view of a conductive contact according to a fourth modification of the first embodiment. In a conductive contact 5 shown in the figure, a flat body section 52 is formed by applying press work to the center section excluding both the ends of the conventional wire probe. As a result, ends 51 at both sides have sharpened ends and, on the other hand, the body section 51 has anisotropy. Therefore, a bending direction is easily controlled in this structure. In this case, as in the case described above, the conductive contact 5 can be manufactured by using the conventional wire probe. Therefore, like the conductive contact 4, it is possible to hold down manufacturing cost low.

It goes without saying that, as in the conductive contact 1, an insulating layer can be formed near the center of the conductive contacts 2 to 5 explained above.

Figure 12:
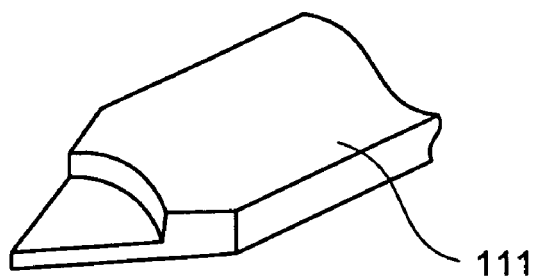
FIG. 12 is a perspective view of a modification (a first example) of the shape of a distal end of the conductive contact according to the first embodiment of the present invention.
Figure 13:
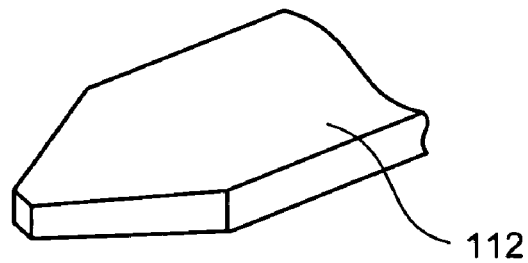
FIG. 13 is a perspective view of a modification (a second example) of the shape of the distal end of the conductive contact according to the first embodiment of the present invention.
Figure 14:
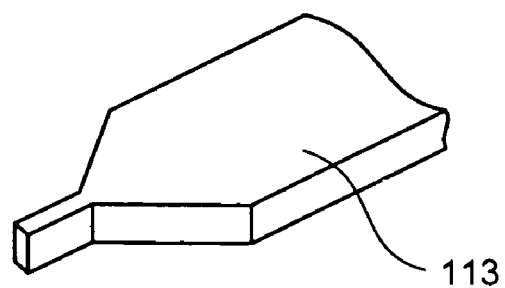
FIG. 14 is a perspective view of a modification (a third example) of the shape of the distal end of the conductive contact according to the first embodiment of the present invention.

FIGS. 12 to 14 are partial perspective views of modifications of the shape of the distal end of the conductive contact according to the first embodiment. The modifications are equivalent to distal ends formed by machining the distal end of the main body section 11 of the conductive contact 1. Among the modifications, a distal end 111 shown in FIG. 12 is formed by machining the distal end of the main body section 11 more sharply. A distal end 112 shown in FIG. 13 is formed by chamfering a V-shaped curved surface of the distal end of the main body section of the conductive contact 1. The distal end 113 shown in FIG. 14 is sharpened in a needle shape. As the shapes of the distal ends shown in the figures, optimum shapes only have to be selected according to the circuit structure of an inspection object, the structure of a circuit board of an inspection apparatus. The shape of both the ends of the conductive contact can be formed different.

The distal ends 111 to 113 described above can be formed by applying technologies such as electric discharge machining (including wire electric discharge machining), cutting, turning, and grinding.

Second Embodiment

Figure 15:
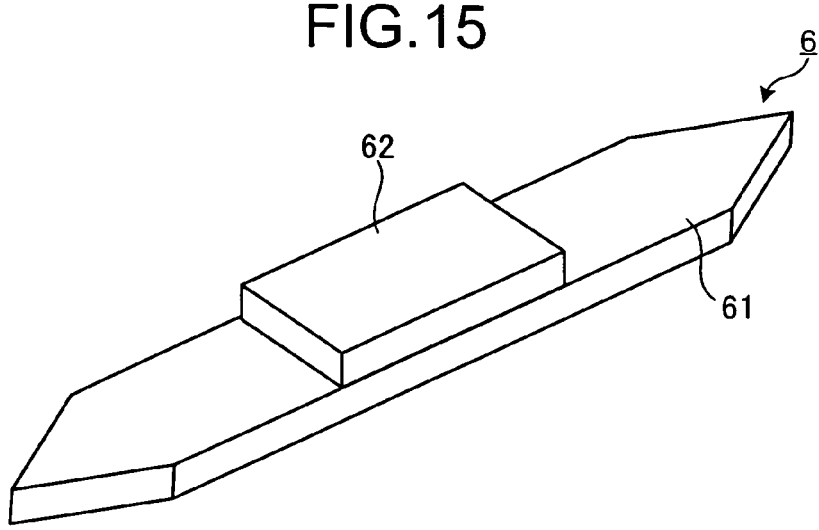
FIG. 15 is a perspective view of a conductive contact according to a second embodiment of the present invention.

FIG. 15 is a perspective view of a conductive contact according to a second embodiment of the present invention. A conductive contact 6 shown in the figure includes a main body section 61 formed in a flat shape and having both ends sharpened in a V shape and a stacked section 62 stacked near the center of the main body section 61 and formed in a rectangular parallelepiped shape having a volume smaller than that of the main body section 61. In the conductive contact 6, as in the first embodiment, a horizontal cross-section perpendicular to a longitudinal direction of the main body section 61 has anisotropy. Therefore, if a plurality of the conductive contacts 6 are attached to the conductive contact unit 200 and offset as in the first embodiment, it is possible to uniformly align a bending direction of the conductive contacts 6.

The main body section 61 and the stacked section 62 are formed of different kinds of metal. For example, metal such as iron (Fe), nickel (Ni), or tungsten (W) excellent in abrasion resistance is used for the main body section 61 and, on the other hand, metal such as copper (Cu), silver (Ag), gold (Au), or palladium (Pd) having low electric resistance is used for the stacked section 62. This makes it possible to realize a conductive contact excellent in abrasion resistance and an electric resistance characteristic. This is an effect that cannot be obtained when the conductive contact is formed of one kind of metal and is an effect peculiar to the second embodiment.

As elements affecting characteristics of the conductive contact, besides the abrasion resistance and the electric resistance, there are stiffness (rigidity), corrosion resistance, low contact resistance, inductance, and the like. Therefore, in forming the conductive contact 6, kinds of metal capable of realizing characteristics that should be given to the conductive contact 6 only have to be combined and stacked. In this sense, the number of kinds of metal that are stacked to form the conductive contact does not have to be two and can be three or more.

In manufacturing the conductive contact 6, as in the first embodiment, the main body section 61 and the stacked section 62 only have to be stacked by applying the machining technologies such as plating, etching (including wet etching and dry etching), electrocasting, lithography (including X-ray lithography and ultraviolet lithography), and electric discharge machining (including wire electric discharge machining).

In the second embodiment, as in the first embodiment, it is also possible to form an insulating layer to cover the peripheries of the main body section 61 and the stacked section 62 of the conductive contact 6. In forming such an insulating layer, a method same as that explained in the first embodiment only has to be applied.

According to the second embodiment of the present invention explained above, by giving anisotropy to the shape of the cross-section perpendicular to the longitudinal direction of the main body section of the conductive contact, it is possible to easily control a direction in which the conductive contact bends when an external force is applied thereto. As a result, when conductive contacts according to the second embodiment are attached to a conductive contact unit to perform electric characteristic inspection, loads on electrodes of the respective conductive contacts are uniformalized. Therefore, it is possible to uniformalize contact resistances in respective contact sections and realize more highly accurate and reliable electric characteristic inspection.

According to the second embodiment, by stacking kinds of meal different from that forming the main body section on the main body section, it is possible to easily give various characteristics to the conductive contact.

Moreover, according to the second embodiment, by forming the insulating layer that covers the surface of the area including a section near the center in the longitudinal direction of the main body section and not including both the ends of the main body section, it is possible to prevent electric short-circuit of conductive contacts adjacent to each other when a plurality of conductive contacts are attached to the conductive contact unit and prevent damages and the like due to contact of the conductive contacts.

Modifications of the Second Embodiment

Figure 16:
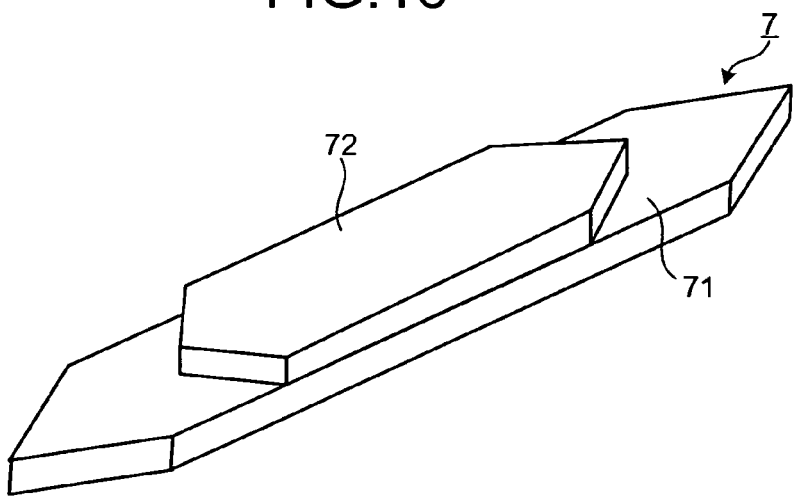
FIG. 16 is a perspective view of a conductive contact according to a first modification of the second embodiment of the present invention.

FIG. 16 is a perspective view of a conductive contact according to a first modification of the second embodiment. In a conductive contact 7 shown in the figure, a stacked section 72 formed in a shape with distal ends in a longitudinal direction sharpened unlike the stacked section 62 is stacked on a main body section 71 formed in a shape same as that of the main body section 61 of the conductive contact 6. By changing a shape of the stacked section in this way, it is possible to set characteristics of the conductive contact 7 different from the characteristics of the conductive contact 6.

Figure 17:
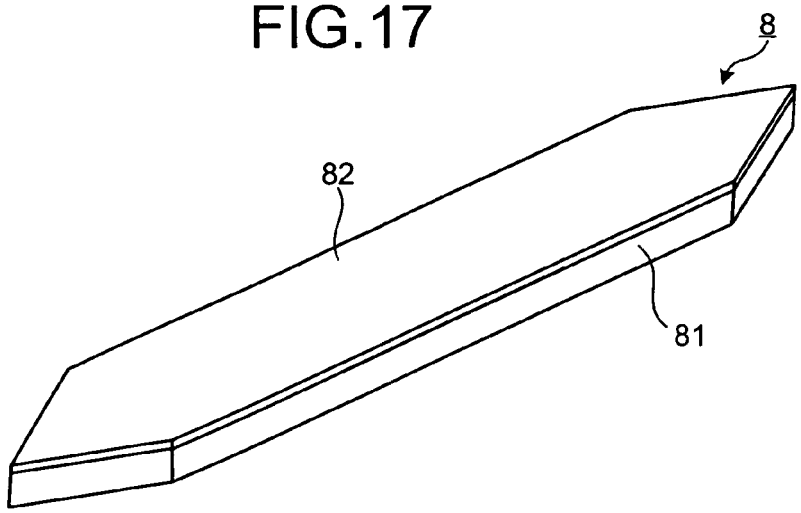
FIG. 17 is a perspective view of a conductive contact according to a second modification of the second embodiment of the present invention.

FIG. 17 is a perspective view of a conductive contact according to a second modification of the second embodiment. In a conductive contact 8 shown in the figure, a main body section 81 and a stacked section 82 having the same surface area are stacked. However, the main body section 81 has larger thickness (plate thickness) in a stacking direction. By changing a ratio of the plate thickness of the main body section 81 and the plate thickness of the stacked section 82, it is also possible to adjust the characteristics of the conductive contact 8.

Figure 18:
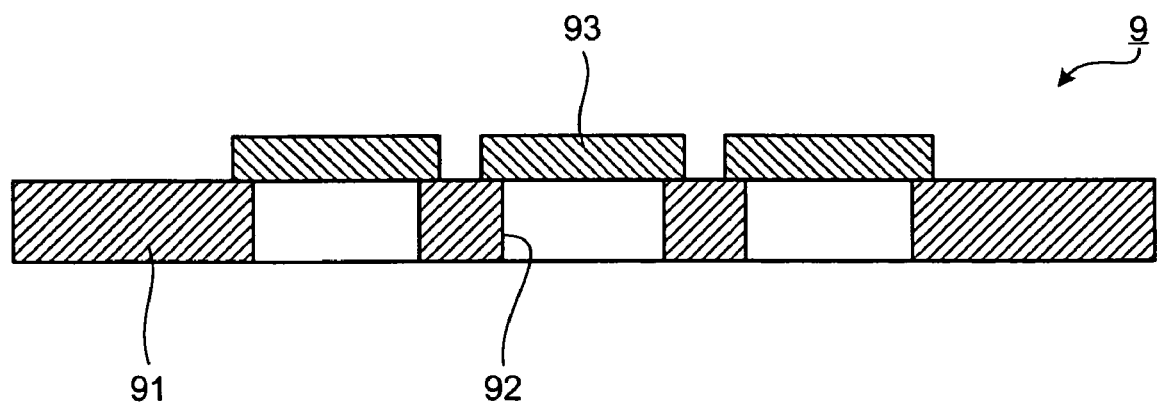
FIG. 18 is a cross-sectional view of a conductive contact according to a third modification of the second embodiment of the present invention.

FIG. 18 is a cross-sectional view of a conductive contact according to a third modification of the second embodiment. In a conductive contact 9 shown in the figure, three through holes 92 are formed in a flat main body section 91 and three stacked sections 93 are stacked to cover opening surfaces on one side of the through holes 92, respectively. The stacked sections 93 can be further stacked on opening surfaces on the other side or can be stacked only in a part of the through holes 92.

It is also possible to form still different modifications by appropriately combining the structures of the conductive contacts 6 to 9 explained above. In the second embodiment, as in the first embodiment, it is possible to narrow a section near the center of the main body section of the conductive contact (see FIG. 9) or apply machining for changing a shape of the distal ends (see FIGS. 12 to 14). The stacked section can be formed of a material other than metal. For example, if resin, resin paint, or the like is stacked on one side or both sides in the structure shown in FIG. 17, actions and effects same as those obtained by coating the insulating layer are obtained. Even when resin is stacked only on one side, because the conductive contacts 8 have anisotropy, bending directions of the conductive contacts 8 are uniformly aligned and the conductive contacts 8 adjacent to each other do not cause short-circuit.

Third Embodiment

A third embodiment of the present invention provides a method of manufacturing a conductive contact suitable in simultaneously manufacturing a large number of conductive contacts including main body sections, horizontal cross-sections of which orthogonal to longitudinal directions have anisotropy, and insulating layers that cover the centers of the main body sections.

Figure 19:
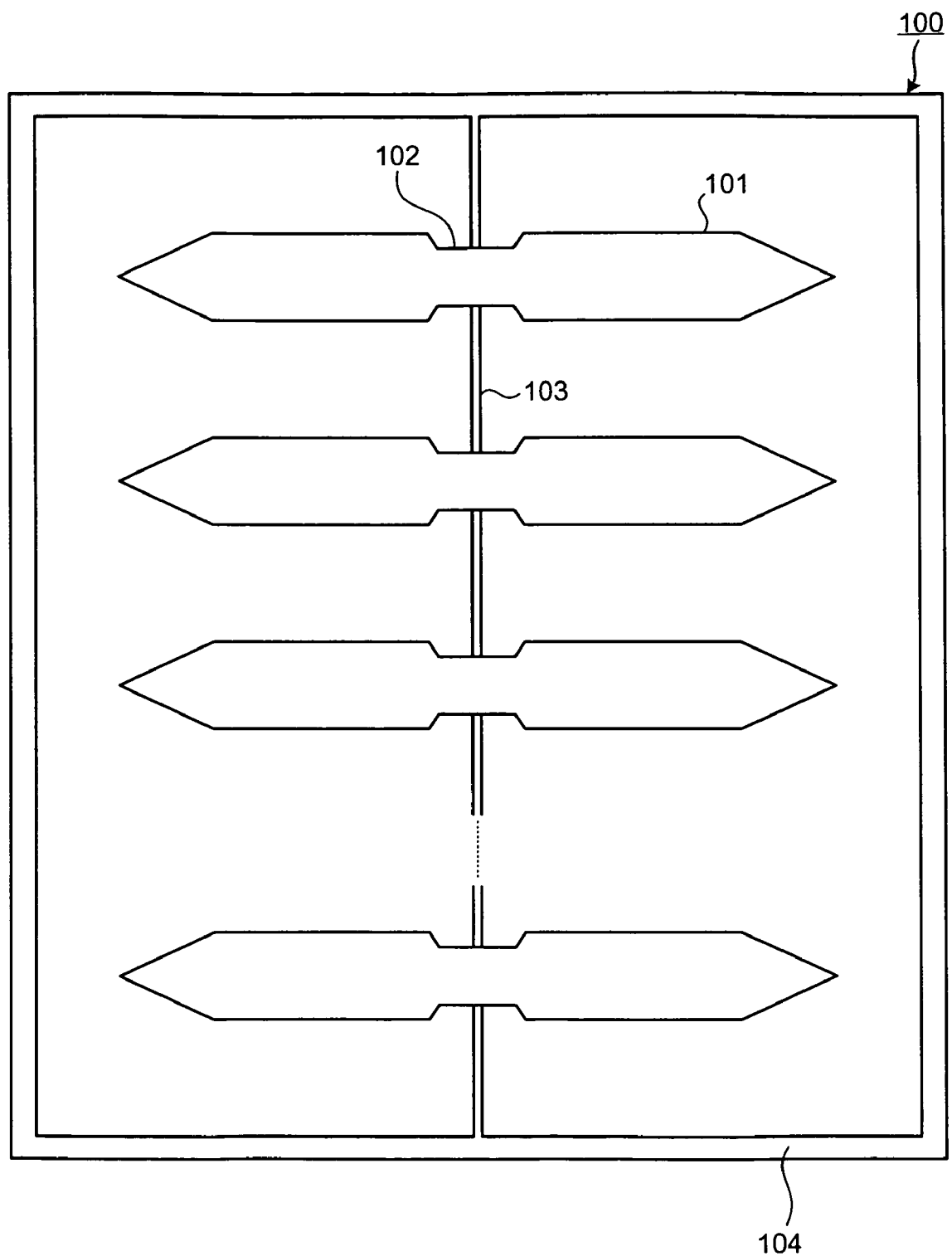
FIG. 19 is a diagram of the structure of a main body section group molded in a molding step of a method of manufacturing a conductive contact according to a third embodiment of the present invention.
Figure 20:
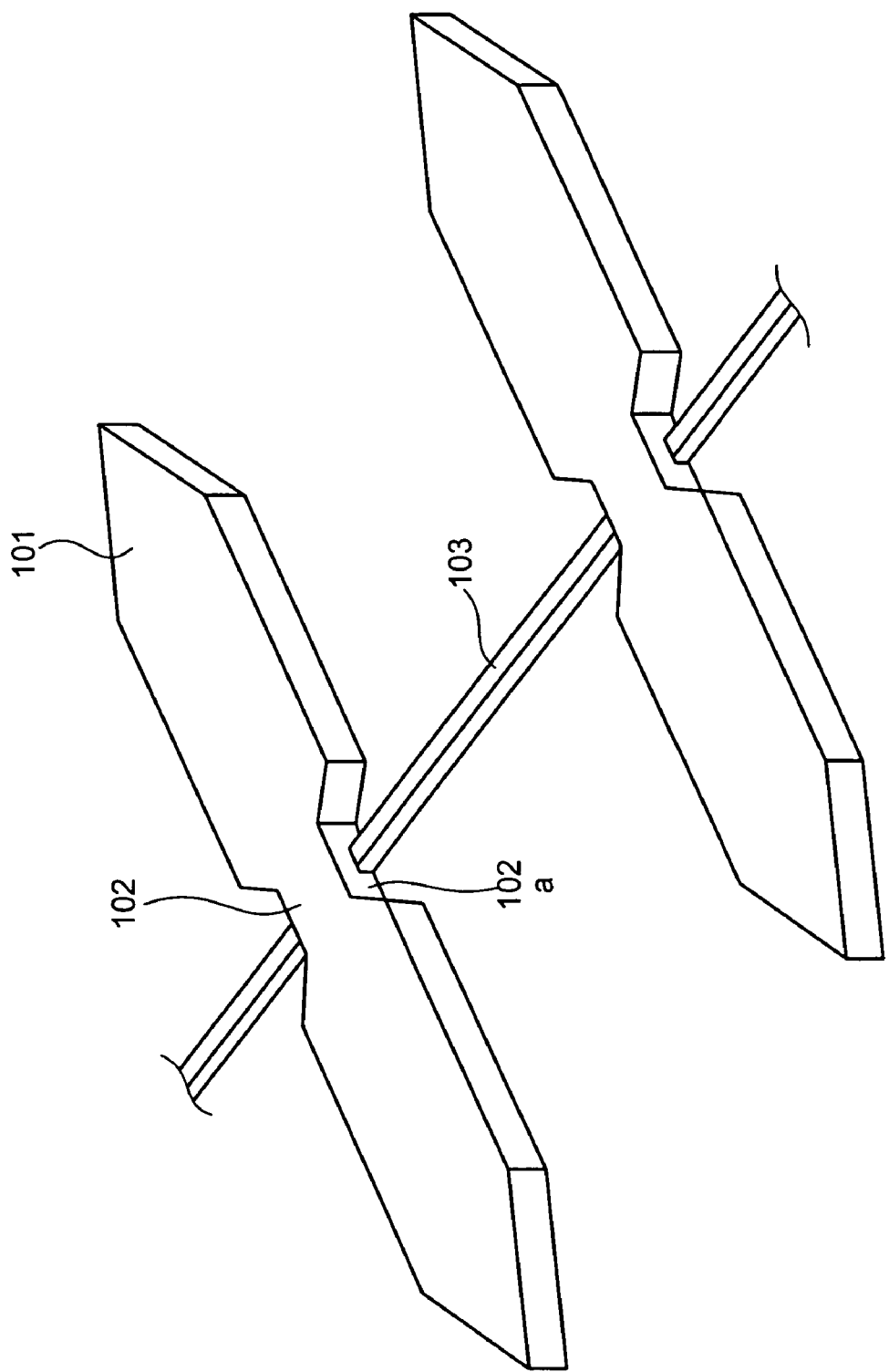
FIG. 20 is a partially enlarged perspective view of main body sections adjacent to each other in the main body section group.

In the method of manufacturing a conductive contact according to the third embodiment, first, a main body section group including main bodies of a plurality of conductive contacts is molded by applying machining technologies plating, etching (including wet etching and dry etching), electrocasting, lithography (including X-ray lithography and ultraviolet lithography), and electric discharge machining (including wire electric discharge machining) (a molding step). FIG. 19 is a diagram of the structure of a main body section group molded by this molding step. FIG. 20 is a partially enlarged perspective view of main body sections adjacent to each other in the main body section group. As shown in the figures, a main body section group 100 is formed by coupling a plurality of main body sections 101 formed in a flat shape and having both ends sharpened in a V shape. In the centers of the main body sections 101, narrowed sections 102 cut out in a direction orthogonal to longitudinal directions of the main body sections 101 are formed. Coupling sections 103 that couple the main body sections 101 adjacent to each other are formed on sides 102a of the narrowed sections 102.

The main body sections 101 formed at farthest ends are coupled to a holding frame section 104 that holds the series of main body sections 101 via the coupling sections 103. As shown in FIG. 19, the holding frame section 104 holds the main body sections 101 such that the longitudinal directions of the respective main body sections 101 are parallel to one another and distal end positions of ends corresponding to the respective main body sections 101 are arranged on one straight line. In this sense, it can be said that the respective main body sections 101 are in a translational symmetry positional relation with respect to a direction in which the main body sections 101 are coupled to the main body sections 101 adjacent thereto (a vertical direction in FIG. 19).

An area of a cross-section (a horizontal cross-section) perpendicular to a longitudinal direction of the coupling section 103 that couples the narrowed sections 102 adjacent to each other has to be smaller than an area of cross-sections perpendicular to the longitudinal directions of the main body sections 101 in the narrowed sections 102. This makes it possible to easily remove the respective main body sections 101 from the main body section group 100 without hurting the main body sections 101.

Figure 21:
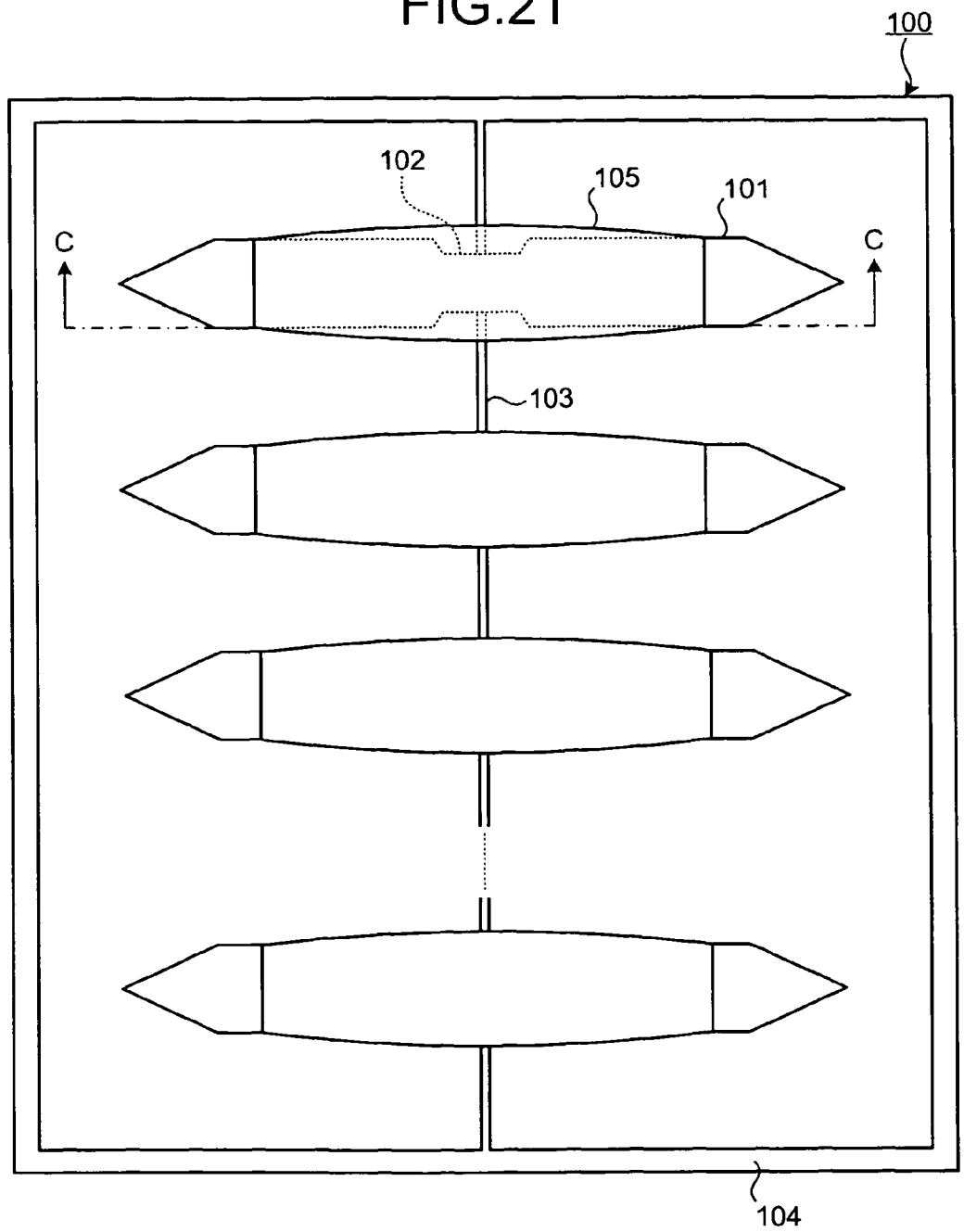
FIG. 21 is a diagram of the structure of a main body section group after an insulating layer forming step of the method of manufacturing a conductive contact according to the third embodiment of the present invention.
Figure 22:
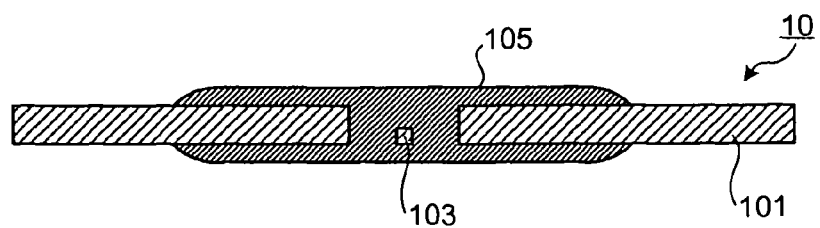
FIG. 22 is a cross-sectional view taken along line C-C in FIG. 21.

Following the molding step explained above, both the ends of the respective main body sections 101 are appropriately masked and, then, insulating layers are formed in the centers of the main body sections 101 not masked (an insulating layer forming step). The insulating layers can be formed in the same manner as the insulating layer 12 of the conductive contact 1 according to the first embodiment. FIG. 21 is a diagram of the structure of the main body section group after the insulating layer forming step is performed. FIG. 22 is a cross-sectional view taken along line C-C in FIG. 21. As shown in FIGS. 21 and 22, gaps between the narrowed sections 102 and the coupling sections 103 are filled with insulating layers 105.

Thereafter, the conductive contacts 10 on which the insulating layers 105 are formed, respectively, are removed from the main body section group 100 (a removing step). In this removing step, the conductive contacts 10 are rotated with a longitudinal direction center axis of the coupling sections 103 as a rotation center to be removed from the main body section group 100. As explained about the molding step, the coupling sections 103 have the area of the horizontal cross-sections smaller than that of the main body sections 101. Therefore, when the conductive contacts 10 are rotated as described above, the coupling sections 103 are disengaged from the sides 102a of the narrowed sections 102 by an action of the rotation. Therefore, it is possible to remove the conductive contacts 10 alone from the holding frame section 104. In removing the conductive contacts 10, the coupling sections 103 are broken near boundaries with the narrowed sections 102. Therefore, it is possible to easily pull out the remains of the coupling sections 103 from the surfaces of the insulating layers 105 and dispose of the remains.

By coupling the coupling sections 103 to the sides 102a of the narrowed sections 102 of the main body sections 101 in this way, after the main body sections 101 are removed, sections where the coupling sections 103 are removed become cavities. The cavities are connected to the surfaces of the sides 102a. However, the surfaces are located on further inside in sufficient depth of the insulating layers 105 than the surfaces of the insulating layers 105. Therefore, even if the adjacent conductive contacts 10 come into contact with each other when the conductive contacts 10 are attached to the conductive contact unit 200, it is not likely that short-circuit or the like is caused.

According to the third embodiment of the present invention explained above, because the main body sections of the conductive contacts are uniformly arranged and molded via the coupling sections, unevenness does not occur in the insulating layers formed in the respective main body sections. Therefore, it is possible to simultaneously manufacture a large number of conductive contacts formed in a uniform shape and realize improvement of productivity.

According to the third embodiment, by coupling the coupling sections to the narrowed sections of the main body sections, the sections where the coupling sections are removed from the insulating layers become cavities. The surfaces having conductivity are located on further inside in sufficient depth of the insulating layers than the surfaces of the insulating layers. Therefore, it is not likely that short-circuit is caused among the conductive contacts attached to the conductive contact unit.

The conductive contact manufactured by the method of manufacturing a conductive contact according to the third embodiment has anisotropy in the shape of the cross-section perpendicular to the longitudinal direction of the main body section as in the first and second embodiments. Therefore, it is possible to easily control a direction in which the conductive contact bends when an external force is applied thereto. As a result, when conductive contacts according to the third embodiment are attached to a conductive contact unit to perform electric characteristic inspection, as in the first and second embodiments, loads on electrodes of the respective conductive contacts are uniformalized. Therefore, it is possible to uniformalize contact resistances in respective contact sections and realize more highly accurate and reliable electric characteristic inspection.

In the case of the third embodiment, as in the first and second embodiments, by forming the insulating layer that covers the surface of the area including a section near the center in the longitudinal direction of the main body section and not including both the ends of the main body section, it is possible to prevent electric short-circuit of conductive contacts adjacent to each other when a plurality of conductive contacts are attached to the conductive contact unit and prevent damages and the like due to contact of the conductive contacts.

Figure 23:
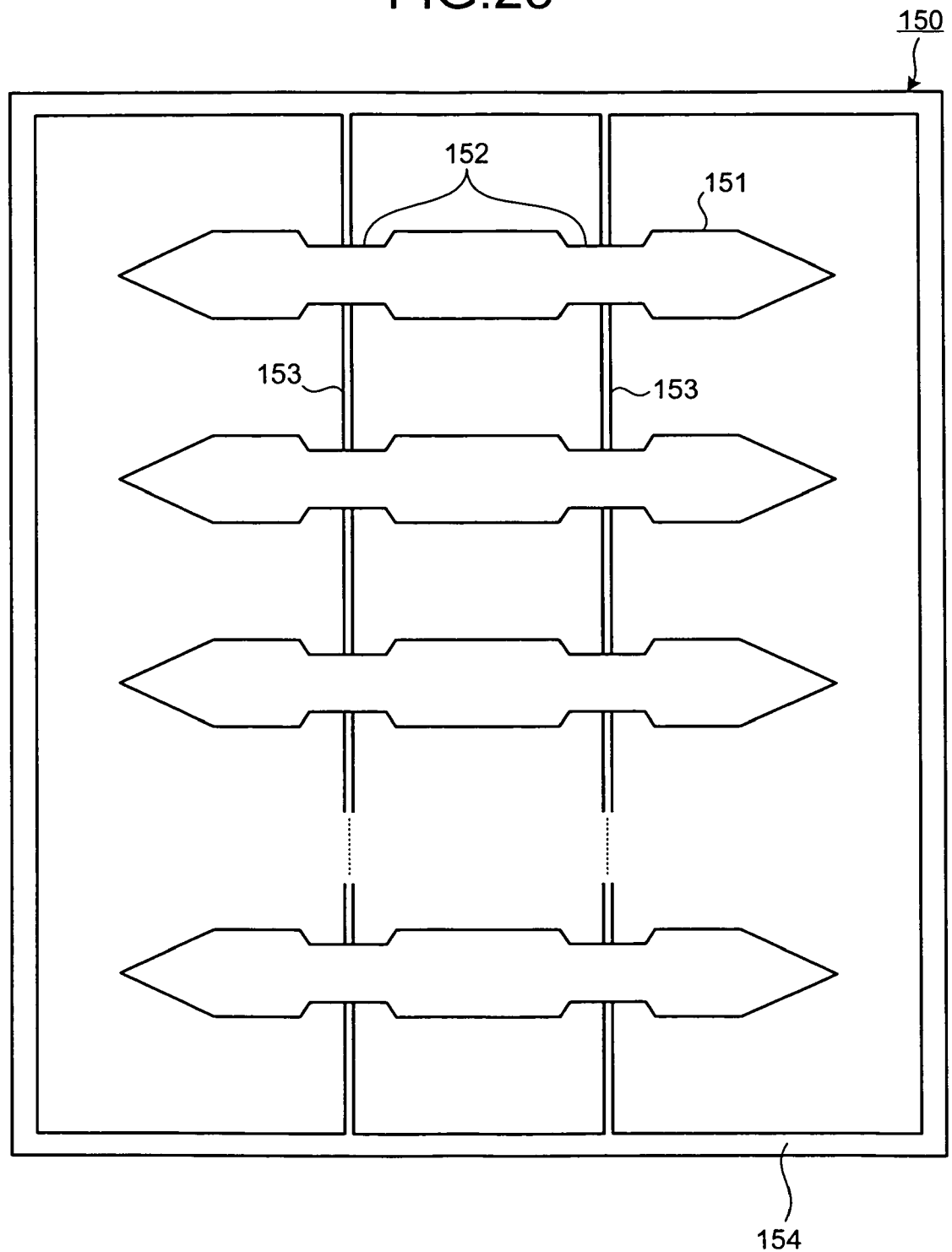
FIG. 23 is a diagram of another example of the structure of the main body section group.

The structure of the main body section group is not limited to that shown in FIG. 19. FIG. 23 is a diagram of another example of the structure of the main body section group. A main body section 151 coupled to a main body section group 150 shown in the figure includes two narrowed sections 152 along a longitudinal direction. Coupling sections 153 are coupled to the respective narrowed sections 152 as in the case of the narrowed sections 102 described above. A plurality of the main body sections 151 are held by a holding frame section 154 while forming a translational symmetry positional relation with one another. Therefore, in the case shown in FIG. 23, the main body sections 151 adjacent to each other are coupled via two coupling sections 153. When a conductive contact is manufactured from the main body section group 150 having such structure, after an insulating layer is formed in the same manner as described above, the coupling sections 153 are rotated with respect to the main body section 151 to separate the main body section 151 and the coupling sections 153. As a result, when all the four coupling sections 153 coupled to the main body section 151 are cut off, the main body section 151 is removed from the main body section group 150.

Other Embodiments

The first to third embodiments have been described in detail as the best modes for carrying out the present invention. However, the present invention should not be limited by only the three embodiments. The present invention can include various embodiments and the like not described in this specification. Various design changes and the like can be applied to the present invention within a range not departing from the technical idea specified by patent claims.

INDUSTRIAL APPLICABILITY

The present invention is suitable as means for establishing, in performing electric characteristic inspection for a circuit configuration including a plurality of connection terminals, electric connection between the circuit configuration and an inspection apparatus.

The invention claimed is:

1. A conductive contact that establishes electric connection with a circuit configuration including a plurality of connection terminals by being in physical contact with any one of the connection terminals, the conductive contact comprising:
a flat main body section, of which a shape of a cross-section perpendicular to a longitudinal direction is anisotropic, the main body section having both ends inserted in a hole of a first plate and a hole of a second plate, respectively, and
a stacked section stacked on the main body section and formed of a material different from that of the main body section,
wherein the main body section is configured to be bent, when the first and second plates of a conductive contact unit are relatively moved in a horizontal direction and center axes of the holes are shifted, so as to bring a surface of the main body section into contact with ends of the holes, the surface being a surface on a long side of the cross-sectional shape.

2. The conductive contact according to claim 1, wherein the cross-section perpendicular to the longitudinal direction of the main body section has a shape symmetrical to each of two axes that pass through the cross-section and are orthogonal to each other.

3. The conductive contact according to claim 2, further comprising an insulating layer that covers a surface of an area including a section near a center in the longitudinal direction of the main body section and not including both ends of the main body section.

4. The conductive contact according to claim 2, wherein one or a plurality of through holes are provided in the main body section.

5. The conductive contact according to claim 2, wherein at least one end of ends in the longitudinal direction of the main body section is sharp.

6. The conductive contact according to claim 2, wherein the conductive contact has a narrowed section formed by cutting out a part of sides in the longitudinal direction of the main body section.

7. The conductive contact according to claim 1, further comprising an insulating layer that covers a surface of an area including a section near a center in the longitudinal direction of the main body section and not including both ends of the main body section.

8. The conductive contact according to claim 1, wherein one or a plurality of through holes are provided in the main body section.

9. The conductive contact according to claim 1, wherein at least one end of ends in the longitudinal direction of the main body section is sharp.

10. The conductive contact according to claim 1, wherein the conductive contact has a narrowed section formed by cutting out a part of sides in the longitudinal direction of the main body section.

11. The conductive contact according to claim 10, wherein the narrowed section is provided near a center in the longitudinal direction of the main body section.

12. A method of manufacturing a conductive contact that establishes electric connection with a circuit configuration including a plurality of connection terminals by being in physical contact with any one of the connection terminals, the method comprising:
molding a main body group in which main body sections of a plurality of conductive contacts formed in a same shape by using metal are coupled while forming a translational symmetry positional relation with one another; and
forming an insulating layer on a surface of an area including a section near a center in a longitudinal direction of each of the main body sections included in the main body section group molded in the molding and not including both ends of each of the main body sections, wherein
in each of the main body sections of the conductive contacts molded in the molding, a shape of a cross-section perpendicular to a longitudinal direction is anisotropic, the main body section includes a narrowed section formed by cutting out a part of sides in the longitudinal direction, and
narrowed sections of the main body sections adjacent to each other are coupled.

13. The method according to claim 12, wherein an area of a cross-section perpendicular to a longitudinal direction of a coupling section that couples the narrowed sections adjacent to each other is smaller than an area of the cross-section perpendicular to the longitudinal direction of the main body section in the narrowed section.

14. The method according to claim 13, further comprising rotating the coupling section coupled to each of the conductive contacts on which the insulating layer is formed in the forming and removing each of the conductive contacts from the main body section group.

* * * * *